(12) United States Patent
Matsuzawa et al.

(10) Patent No.: US 9,304,399 B2
(45) Date of Patent: Apr. 5, 2016

(54) RESIST COMPOSITION AND METHOD FOR PRODUCING SEMICONDUCTOR DEVICE

(71) Applicant: Sony Corporation, Tokyo (JP)

(72) Inventors: Nobuyuki Matsuzawa, Tokyo (JP); Isao Mita, Kumamoto (JP); Koji Arimitsu, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/279,795

(22) Filed: May 16, 2014

(65) Prior Publication Data

US 2014/0248777 A1  Sep. 4, 2014

Related U.S. Application Data

(62) Division of application No. 13/238,004, filed on Sep. 21, 2011, now Pat. No. 8,765,353.

(30) Foreign Application Priority Data

Sep. 28, 2010 (JP) ................... 2010-217862

(51) Int. Cl.
*G03F 7/40* (2006.01)
*G03F 7/30* (2006.01)
*H01L 21/027* (2006.01)

(52) U.S. Cl.
CPC .. *G03F 7/40* (2013.01); *G03F 7/30* (2013.01); *H01L 21/0273* (2013.01)

(58) Field of Classification Search
None
See application file for complete search history.

(56) References Cited

U.S. PATENT DOCUMENTS

2006/0246377 A1* 11/2006 Yamato et al. ............... 430/311

FOREIGN PATENT DOCUMENTS

| JP | 2000-035665 | 2/2000 |
| JP | 2000-298356 | 10/2000 |

OTHER PUBLICATIONS

Derwent English abstract for JP2000-298356 (2000).*
Machine-assisted English translation for JP2000-298356 provided by JPO (2000).*
Machine-assisted English translation of JP 2000-035665 as provided by JPO (2000).

* cited by examiner

*Primary Examiner* — Sin Lee
(74) *Attorney, Agent, or Firm* — Hazuki International, LLC

(57) ABSTRACT

A resist composition includes: a crosslinking material that is crosslinked in the presence of an acid; an acid amplifier; and a solvent.

5 Claims, 3 Drawing Sheets

RESIST COMPOSITION AND METHOD FOR PRODUCING SEMICONDUCTOR DEVICE

RELATED APPLICATION DATA

This application is a division of U.S. patent application Ser. No. 13/238,004 filed Sep. 21, 2011, the entirety of which is incorporated herein by reference to the extent permitted by law. The present application claims the benefit of priority to Japanese Patent Application No. JP 2010-217862 filed on Sep. 28, 2010 in the Japan Patent Office, the entirety of which is incorporated by reference herein to the extent permitted by law.

FIELD

The present technology relates to a resist composition that reduces a size of an opening of a pattern for forming a resist pattern in a production process of a semiconductor device, and a method for producing a semiconductor device using the resist composition.

BACKGROUND

Associated with the high integration of semiconductor devices in recent years, the pattern size demanded in the production process is being considerably miniaturized. In an ordinary production process of a fine pattern or a fine impurity distribution, a resist pattern is formed by the photolithography technique, and the resist pattern thus formed is used as a mask. For example, a fine pattern is formed by etching various kinds of thin films on a substrate with the resist pattern thus formed used as a mask, and a fine impurity distribution is formed by ion injection to the substrate with the resist pattern thus formed used as a mask.

Upon forming the fine pattern, the photolithography technique is important. The photolithography technique contains processes of resist coating, exposure and development. Miniaturization of a pattern with the photolithography technique has been achieved mainly by decreasing the exposure wavelength. However, the decrease of the exposure wavelength encounters technical limitation, and the production cost is increased by decreasing the exposure wavelength. Thus, there is limitation in decreasing the exposure wavelength.

Under the circumstances, a method for producing a fine resist pattern beyond the limitation of the photolithography technique by exposure has been proposed (see, for example, JP-A-2000-298356). In the method for producing a resist pattern, a resist pattern having been produced by the photolithography technique is subjected to an additional process, thereby further miniaturizing the resist pattern.

In the technique proposed in JP-A-2000-298356, a first resist layer capable of generating an acid is formed on a semiconductor substrate, and a first resist pattern is formed through exposure and development. A second resist layer capable of undergoing crosslinking reaction with the acid present on the first resist pattern is then formed. A crosslinked layer is then formed with the acid supplied from the first resist pattern at the portion where the second resist layer is in contact with the first resist pattern. Thereafter, the portion of the second resist layer that is not crosslinked is dissolved and removed with water or an aqueous solution of a water-soluble organic solvent, thereby forming a second resist pattern. The process of forming the second resist pattern is performed repeatedly, thereby forming a target resist pattern.

Specifically, upon patterning the first resist layer through exposure, an acid is generated at the portion of the first resist layer that is irradiated with light. Through catalytic reaction of the acid thus generated, the portion of the first resist layer that has the acid present therein becomes soluble in the developer solution. The portion of the first resist layer that has became soluble in the developer solution is removed in the development process, but the first resist layer that is adjacent to that portion has a certain amount of the acid present therein. However, the reaction catalyzed with the acid does not proceed to an extent that the resist layer becomes soluble in the developer solution, and thus the acid remains after the development. Consequently, the remaining portion of the first resist layer adjacent to the portion that has been removed through the development has the acid molecules present therein.

In the technique disclosed in JP-A-2000-298356, the second resist layer capable of undergoing crosslinking reaction in the presence of an acid is formed on the first resist pattern. The acid molecules remaining in the first resist pattern are then diffused into the second resist layer by a method of heating or the like. According to the procedure, the second resist layer that is adjacent to the first resist layer containing the acid molecules present therein is insolubilized through the crosslinking reaction.

In the technique, the portion of the second resist layer that has undergone the crosslinking reaction remains mainly in the side wall of the opening of the first resist pattern, and thereby the size of the opening of the resist pattern may be further decreased.

SUMMARY

In the technique, however, a crosslinked layer is formed in the second resist layer that is in contact with the first resist pattern, with the acid supplied from the first resist pattern. Accordingly, when the amount of the acid supplied from the first resist pattern is small, the crosslinked layer may not formed sufficiently, and the opening may be insufficiently miniaturized. In particular, associated with the increasing demand of miniaturization of patterns, the size of the opening is further demanded to be miniaturized, and thus the technique may fail to achieve the sufficient miniaturization demanded.

Consequently, the technique of forming a miniaturized pattern through formation of the crosslinking layer in the second resist layer with the acid supplied from the first resist pattern has such a problem that a miniaturized pattern may not be sufficiently formed due to shortage of the amount of the acid supplied from the first resist pattern.

Accordingly, there is a need for a resist composition and a method for producing a semiconductor device that are capable of miniaturizing an opening of a resist pattern.

According to an embodiment of the present technology, there is provided a resist composition containing a crosslinking material that is crosslinked in the presence of an acid, an acid amplifier, and a solvent.

According to another embodiment of the present technology, there is provided a method for producing a semiconductor device, containing: forming a first resist pattern capable of supplying an acid, with a first resist composition, on a semiconductor substrate; forming a second resist layer by coating a second resist composition containing a crosslinking material that is crosslinked in the presence of an acid, an acid amplifier, and a solvent, on the first resist pattern; forming a crosslinked portion in the second resist layer by diffusing an acid from the first resist pattern into the second resist layer; and removing a portion of the second resist layer that is not crosslinked.

According to the resist composition of the embodiment of the present technology, the crosslinking material that is crosslinked in the presence of an acid and the acid amplifier are contained, and therefore acid amplification reaction occurs with the acid amplifier in the presence of the acid. Accordingly, the acid may be generated in an amount that is sufficient for crosslinking the crosslinking material with the action of the acid amplifier, irrespective of the amount of the acid that is present in advance. Consequently, a crosslinked layer can be formed.

According to the method for producing a semiconductor device of the embodiment of the present technology, the first resist pattern supplying an acid is formed, and the second resist composition is coated thereon. The second resist composition contains the acid amplifier, and therefore, acid amplification reaction occurs with the acid amplifier based on the acid supplied from the first resist pattern. The number of the acid molecules present in the second resist layer can be increased through the acid amplification reaction. The crosslinking material that is crosslinked in the presence of an acid included in the second resist composition forms a crosslinked portion with the acid supplied from the first resist pattern and the acid generated through the acid amplification reaction. At this time, the acid is present in the sufficient amount through the acid amplification reaction, and thus the crosslinking amount of the second resist layer can be increased. Consequently, a finer opening pattern can be formed in a miniaturization method by forming a crosslinked layer at a portion of the second resist that is in contact with the first resist pattern, by supplying an acid from the first resist pattern.

According to the embodiments of the present technology, there are provided the resist composition and the method for producing a semiconductor device that are capable of miniaturizing an opening of a resist pattern.

DETAILED DESCRIPTION

Embodiments of the present technology are described below, but the present technology is not limited to the embodiments in any way.

The following description are made in the following order.
1. Embodiment of method for producing semiconductor device
2. Examples of method for producing semiconductor device

1. Embodiment of Method for Producing Semiconductor Device

An embodiment of a method for producing a semiconductor device of the present technology will be described.

Figure 1A:
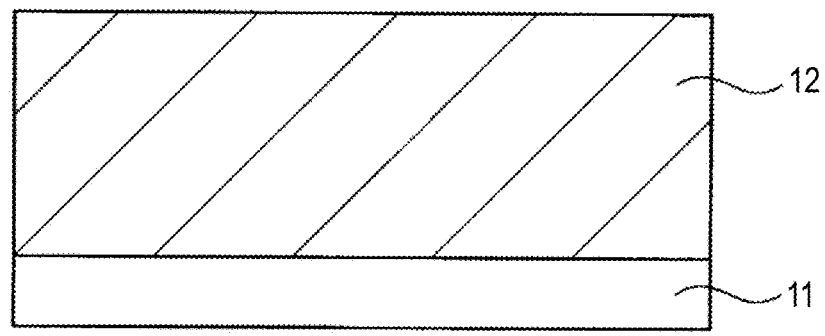
FIGS. 1A to 1C are illustrations for a process diagram showing an example of a method for producing a semiconductor device according to an embodiment of the present technology.
Figure 1B:
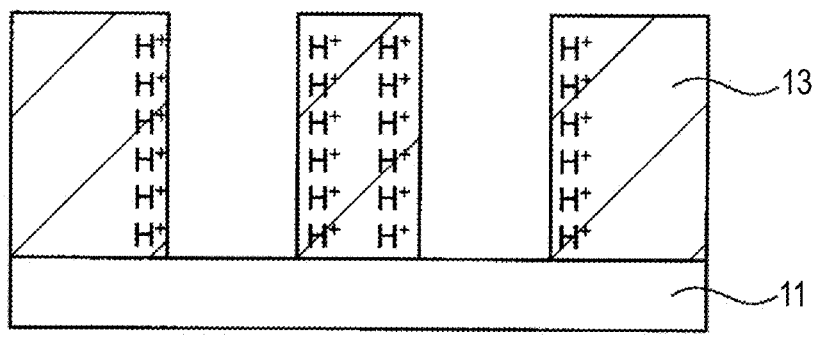
Figure 1C:
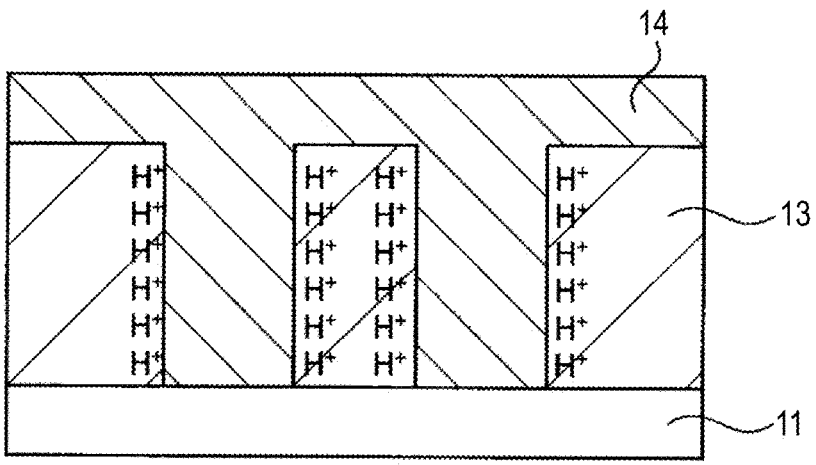

FIGS. 1A to 1C show a process diagram showing an example of a method for producing a semiconductor device according to the embodiment. FIGS. 1A to 1C each are a cross sectional view showing a structure formed on a substrate. In the following example, a case where the embodiment is applied to a positive resist is described, but the embodiment may also be applied similarly to a negative resist.

[Method for Producing Semiconductor Device: First Step]

As shown in FIG. 1A, a first resist layer 12 containing a first resist is formed on a semiconductor substrate 11. The first resist supplies an acid from the interior of the resist layer by a heat treatment. The first resist layer 12 may be formed, for example, by a spin coating method or the like. For example, the first resist is spin-coated on the semiconductor substrate 11, and the solvent contained therein is evaporated by heating to approximately from 70 to 120° C. for a period of approximately 1 minute, thereby forming the first resist layer 12. The first resist layer 12 may have a thickness of approximately from 0.04 to 5 µm.

For forming a pattern with the first resist composition, an active energy ray is radiated to the first resist layer 12 through a photomask having a pattern to be transferred (the operation will be hereinafter referred to as exposure). Examples of the active energy ray include a g-ray, an i-ray, a KrF (krypton fluoride) laser light, an ArF (argon fluoride) laser light, an F2 laser light, an EUV (extreme ultraviolet) ray, an X-ray and an electron beam. In the case where an electron beam is used, the first resist layer 12 may be scanned with the electron beam without a photomask.

The first resist composition is not particularly limited in structure and formulation, and may contain a component that generates an acid upon irradiation with an active energy ray. In alternative, a resist composition that contains an acid in advance may be used. Examples of the resist composition include compositions containing a novolak resin having a protective group, a polyhydroxystyrene resin, an acrylic resin or the like, to which an onium salt photo-acid generating agent, or the like is added. The resist composition may contain a basic compound depending on necessity for neutralizing a part of the acid generated. Preferred examples of an acid that is contained in the first resist composition in advance include low molecular weight organic acid, such as a carboxylic acid. The formulation is an ordinary chemically amplified resist, but the embodiment is not limited thereto.

The first resist layer 12 is exposed, and then subjected to a heat treatment, which is referred to as a PEB (post exposure bake) treatment, depending on necessity. The heat treatment may be performed at a temperature of approximately from 60 to 145° C. for a period of approximately 1 minute. The resist may be enhanced in sensitivity and resolution characteristics by the treatment.

Subsequently, the portion of the first resist layer 12 that has been irradiated with an active energy ray is removed by developing, for example, with an aqueous solution of TMAH (tetramethylammonium hydroxide) (concentration: 0.01 to 4% by mass). Thus, a prescribed first resist pattern 13 as shown in FIG. 1B is formed.

After the development, the whole or part of the first resist pattern 13 may be exposed again for further generating an acid in the resist pattern, depending on necessity. Furthermore, a heat treatment may be performed again subsequent to the exposure.

In an ordinary chemically amplified resist, an acid derived from a photo-acid generating agent is formed in the exposed portion. The protective group in the resin as a major component of the resist is deprotected through catalytic reaction of the acid thus generated, and an organic acid, such as a carboxylic acid, is generated. The portion having the organic acid generated therein becomes soluble in an alkaline developer solution, such as an aqueous solution of TMAH (tetramethylammonium hydroxide). Accordingly, the exposed portion is dissolved in the developer solution, thereby forming a resist pattern with the remaining portion.

In the side wall portion of the first resist pattern 13, a slight amount of an acid is generated through irradiation with light with a certain intensity. The resin component in the resist is deprotected with the slight amount of the acid, but the degree of deprotection is insufficient, and the side wall portion is not dissolved in the developer solution and remains as a resist pattern.

Accordingly, in the case where the first resist composition is an ordinary chemically amplified resist, the acid exists locally in the side wall of the first resist pattern 13 as shown in FIG. 1B. In the figures, the acid existing locally in the side wall of the first resist pattern 13 is expressed by a hydrogen ion ($H^+$).

Subsequently, a second resist composition is coated on the first resist pattern 13 by a spin coating method or the like, thereby forming a second resist layer 14 as shown in FIG. 1C. In the following description, the second resist composition may be referred to as a chemical shrink material in some cases. After coating, the chemical shrink material may be heated to 80 to 105° C. for approximately 1 minute depending on necessity for evaporating the solvent.

In the portion of the second resist layer 14 that is in contact with the side wall of the first resist pattern 13, the number of the acid molecules is increased through acid amplification reaction occurring with the acid ($H^+$) from the first resist pattern 13. A crosslinked layer is formed through crosslinking reaction caused by the acid from the first resist pattern 13 and the acid amplified therewith. The portion of the second resist layer 14 that is not crosslinked is removed.

Embodiments of Second Resist Composition

The second resist composition (i.e., the chemical shrink material) contains an acid amplifier that causes acid amplification reaction in the portion in contact with the side wall of the first resist pattern 13, a crosslinking material that is crosslinked in the presence of an acid, and a solvent.

The chemical shrink material forming the second resist layer 14 desirably does not cause affect on the first resist pattern 13 upon coating the chemical shrink material. The affect herein includes dissolution, swelling or the like of the first resist pattern, and changes of the shape, property or the like of the first resist layer 13.

Accordingly, the chemical shrink material may be coated by using a solvent that does not cause dissolution or the like of the first resist pattern 13. Examples of the solvent include water, a mixed solvent of water and a water-soluble organic solvent, and a water-soluble organic solvent or an organic solvent that does not cause affect on the first resist pattern 13, which may be used solely or as a mixture thereof.

Examples of the water-soluble organic solvent include an alcohol, such as ethanol, methanol and isopropyl alcohol, γ-butyrolactone, acetone and N-methylpyrrolidone. The water-soluble organic solvent may be mixed depending on the solubility of the materials used as the second resist composition, in such a range that the first resist pattern 13 is not dissolved.

Examples of the organic solvent that does not cause affect on the first resist pattern 13 include an alcohol solvent and an ether solvent, such as ethanol, methanol, isopropyl alcohol and dimethyl ether, which may be used solely or as a mixture thereof.

The acid amplifier contained in the chemical shrink material may be soluble in the solvent, e.g., water, the mixed solvent of water and a water-soluble organic solvent or the organic solvent, and may cause acid amplification reaction in the solvent.

Examples of the acid amplifier soluble in the solvent include an inclusion complex of an acid amplifier such as a diol monosulfonate and a compound represented by the following general formula (1) and an inclusion compound represented by the following general formula (2).

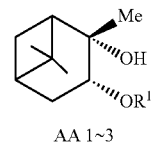

AA 1~3

$R^1 = 1: SO_2(CH_2)_7CH_3$

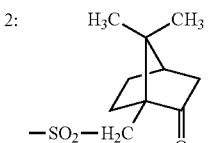

2:

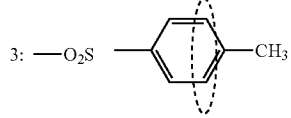

3:

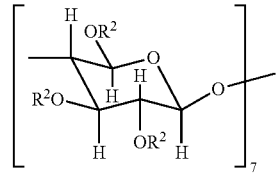

(2)

$R^2 = H, CH_3$

The compound represented by the general formula (1) is the acid amplifier itself. In the case where $R^1$ is the substituent 1 in the general formula (1), the compound is cis-3-(1-octanesulfonyloxy)-2-pinanol (AA1). In the case where $R^1$ is the substituent 2, the compound is cis-3-((+)-10-camphorsulfonyloxy)-2-pinanol (AA2). In the case where $R^1$ is the substituent 3, the compound is (cis-3-(p-toluenesulfonyloxy)-2-pinanol (AA3). The compounds AA1 to AA3 all have a sulfonyl group (—S(=O)$_2$—) in the substituent $R^1$. The compounds AA1 to AA3 are all insoluble in water.

The compound represented by the general formula (2) is an inclusion compound. The compound of the general formula (2) is an example of a cyclodextrin derivative, and a structure of methyl-β-cyclodextrin is shown. A cyclodextrin is one kind of a cyclic oligosaccharide that contains several D-glucose molecules bonded through α-1,4-glucoside bond to form a cyclic structure. For example, a compound containing six glucose molecules bonded circularly is referred to as α-cyclodextrin, a compound containing seven glucose molecules bonded circularly is referred to as β-cyclodextrin, and a compound containing eight glucose molecules bonded circularly is referred to as γ-cyclodextrin.

A cyclodextrin has a hydrophobic interior and a hydrophilic exterior. Accordingly, a cyclodextrin itself is soluble in water, and has such a property that a hydrophobic compound soluble only in an organic solvent is included in the cyclodextrin ring, thereby making the hydrophobic compound water-soluble.

Upon adding AA1 to AA3 into an aqueous solution of a cyclodextrin, AA1 to AA3, which are originally water-insoluble, are included in the cyclic structure of a cyclodextrin and become water-soluble. In other words, an inclusion complex is produced with the acid amplifier as a guest molecule and the inclusion compound as a host molecule, and thereby the water-insoluble acid amplifier can be dissolved in an aqueous solvent.

In addition to the acid amplifiers and the inclusion compounds mentioned above, examples thereof also include known acid amplifiers, such as compounds (3) to (13) below, and inclusion compounds capable of forming a water-soluble inclusion complex with the acid amplifiers.

(3) cis-1-phenyl-2-(p-toluenesulfonyloxy)-1-cyclohexanol
(4) cis-1-methyl-2-(p-toluenesulfonyloxy)-1-cyclohexanol
(5) cis-1-methyl-2-(1-octanesulfonyloxy)-1-cyclohexanol
(6) cis-1-methyl-2-((+)-10-camphorsulfonyloxy)-1-cyclohexanol
(7) p-toluenesulfonyloxycyclohexane
(8) p-toluenesulfonyloxycyclopentane
(9) 1,3-di(p-toluenesulfonyloxy)cyclohexane
(10) 1,4-di(p-toluenesulfonyloxy)cyclohexane
(11) 3-phenyl-3,3-ethylenedioxy-1-propyl-p-toluene sulfonate
(12) 4-(tert-butoxycarbonyloxy)benzyl-p-toluene sulfonate
(13) tert-butyl-2-methyl-2-(p-toluenesulfonyloxymethyl)acetoacetate In the case where an acid amplifier exhibits sufficient solubility in a solvent used, the acid amplifier may be used solely without forming an inclusion complex. For example, in the case where an acid amplifier exhibits sufficient solubility in an aqueous solvent, the acid amplifier may be used solely without forming the inclusion compound.

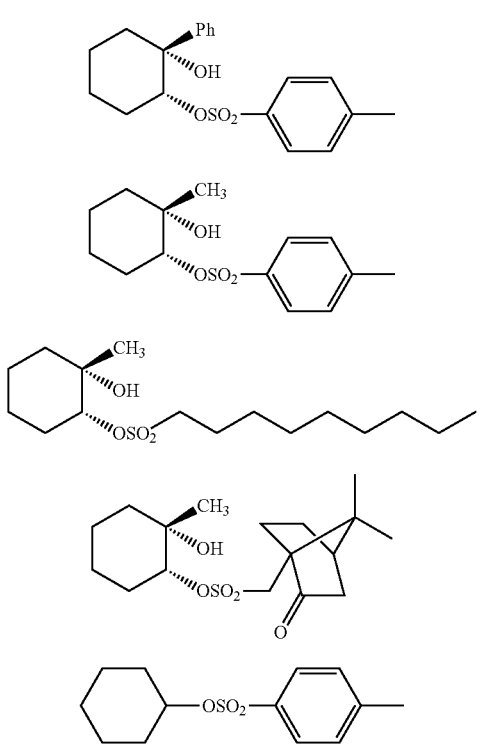

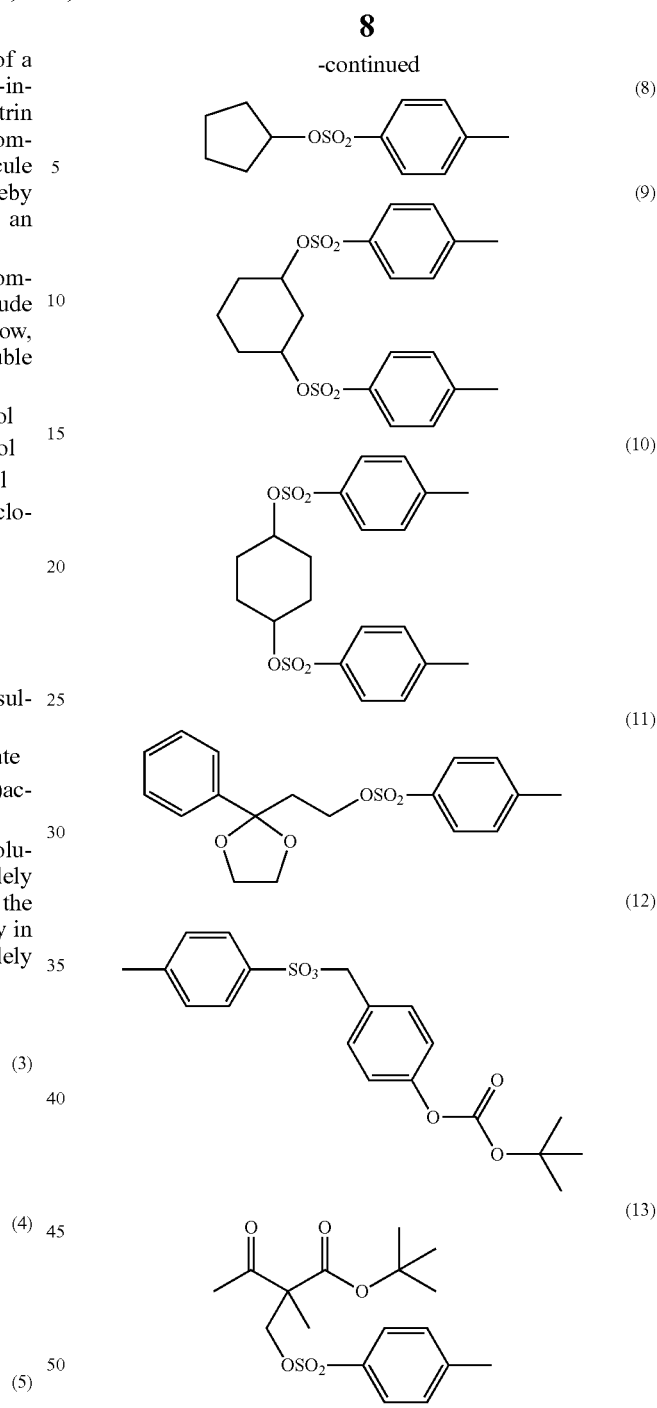

The crosslinking material contained in the chemical shrink material may be one kind or two or more kinds of crosslinking resins, one kind or two or more kinds of crosslinking agents, or a mixture thereof. In the case where water or a mixed solvent of water and a water-soluble organic solvent is used as the solvent, a water-soluble resin and a water-soluble crosslinking agent are preferably used.

Examples of the crosslinking resin include a polyvinyl acetal resin, a polyvinyl alcohol resin, a polyacrylic acid resin, an oxazoline-containing water-soluble resin, an aqueous urethane resin, a polyallylamine resin, polyethyleneimine resin, a polyvinylamine resin, a water-soluble phenol resin, a water-soluble epoxy resin, a polyethyleneimine resin and a styrene-maleic acid copolymer, which may be used solely or as a mixture thereof. Examples of the crosslinking agent include a melamine crosslinking agent, such as methylol melamine and methoxymethylol melamine, a urea crosslinking agent, such as methoxymethylol urea and ethylene urea, and an amino crosslinking agent, such as isocyanate, benzoguanamine and glycoluril, which may be used solely or as a mixture thereof.

The crosslinking material is not limited to the resins and crosslinking agents mentioned above, and a crosslinking agent and a crosslinking resin having a crosslinking group that are soluble in the solvent used and form crosslinking with the acid may be used. In the case of an aqueous solvent is used, in particular, any one of a water-soluble crosslinking agent that is soluble in the aqueous solvent and forms crosslinking with the acid, and a water-soluble resin having a crosslinking group that forms crosslinking with the acid may be used.

In the case where a mixture is used as the crosslinking material, a suitable formulation thereof may be determined depending on the first resist composition used, the reaction conditions employed, and the like.

[Method for Producing Semiconductor Device: Second Step]

After forming the second resist layer 14 by coating the chemical shrink material, a heat treatment is performed for diffusing the acid in the first resist pattern into the second resist layer 14 (the treatment is referred to as a mixing bake treatment). The conditions for the mixing bake treatment may be, for example, a temperature of from 70 to 150° C. for a period of approximately from 1 to 2 minutes.

Figure 2D:
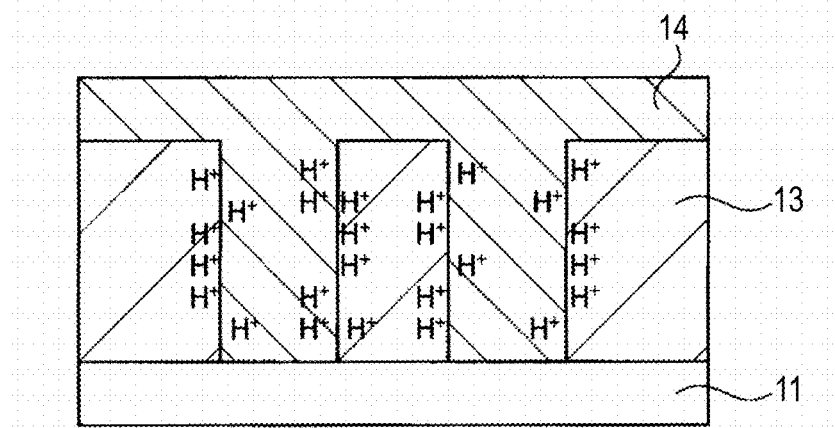
FIGS. 2D to 2F are illustrations for a process diagram showing an example of a method for producing a semiconductor device according to an embodiment of the present technology.
Figure 2E:
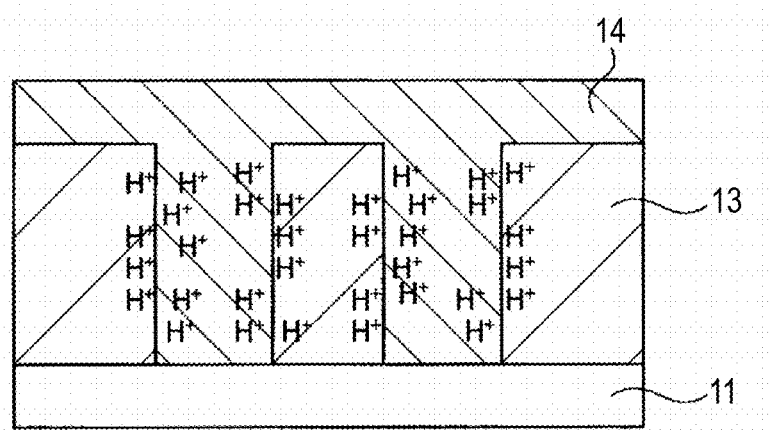

The acid in the first resist pattern 13 is diffused into the layer formed of the chemical shrink material by the mixing bake treatment as shown in FIG. 2D. Upon diffusing the acid from the first resist pattern 13 to the second resist layer 14, the acid amplifier contained in the chemical shrink material is decomposed through catalytic reaction of the acid thus diffused. According to the mechanism, an acid is generated in the second resist layer 14 as shown in FIG. 2E. A detailed example of the reaction is shown in the reaction scheme (14) below.

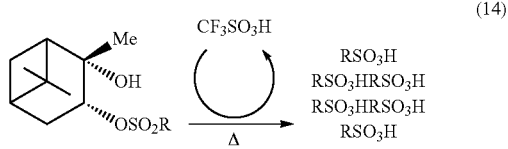

(14)

In the reaction scheme (14), $CF_3SO_3H$ is shown as an example of the acid diffused from the first resist pattern 13 into the second resist layer 14. In the second resist layer 14, the acid amplifier is decomposed through catalytic reaction of $CF_3SO_3H$ to form a sulfonic acid ($RSO_3H$).

In the reaction, one sulfonic acid molecule forms another one sulfonic acid molecule without consuming the original sulfonic acid molecule. Accordingly, the number of sulfonic acid molecules is increased to two in total. In the acid amplification reaction, the aforementioned reaction occurs as chain reaction, thereby increasing the amount of the acid.

In the mixing bake treatment, acid molecules are diffused into the chemical shrink material and cause the acid amplification reaction. The acid functions as a catalyst to the acid amplifier through the mixing bake treatment, thereby inducing the acid amplification reaction. The acid further induces the crosslinking reaction in the chemical shrink material, and the portion of the second resist layer that has the acid present therein becomes insoluble in various solvents.

In the case where the temperature range that is suitable for diffusing the acid from the first resist layer 13 to the second resist layer 14 in the mixing bake treatment is different from the temperature range that is suitable for performing the acid amplification reaction after diffusing the acid, the temperature may be changed stepwise to the suitable temperatures, thereby providing a favorable crosslinked portion. In other words, the diffusion of the acid into the second resist layer 14 and the acid amplification reaction in the second resist layer 14 may be performed under conditions different from each other.

For example, the mixing base treatment for accelerating the diffusion of the acid from the first resist layer 13 to the second resist layer 14 as shown in FIG. 2D may be performed as a first heat treatment, and a second heat treatment for accelerating the acid amplification reaction in the second resist layer 14 as shown in FIG. 2E may be performed.

The first heat treatment for accelerating the diffusion of the acid may be performed, for example, at a temperature of from 70 to 150° C. for a period of approximately from 1 to 2 minutes. Thereafter, the second heat treatment for the acid amplification reaction may be performed at a temperature of from 80 to 160° C. for a period of from 1 to 3 minutes.

The suitable temperature ranges in the first heat treatment and the second heat treatment may be arbitrary temperatures that correspond to the materials used in the first resist composition and the chemical shrink material. Even in the case where the first heat treatment and the second heat treatment are performed separately, it is considered that the diffusion of the acid and the acid amplification reaction occur continuously. Specifically, it is considered that the acid amplification reaction occurs also in the heating within the temperature range for the first heat treatment, and the diffusion of the acid occurs also in the heating within the temperature range for the second heat treatment, whereby the diffusion and the reaction occur continuously.

In the second resist layer 14, the crosslinking material undergoes crosslinking reaction with the acid from the first resist pattern 13 and the acid molecules thus amplified through the acid amplification reaction. A crosslinked layer is formed through the crosslinking reaction at the portion that is in contact with the side wall of the first resist pattern 13. The resist patterns are washed with a solvent that does not dissolve the first resist pattern 13. The non-crosslinked portion of the second resist pattern 14 is dissolved and removed by washing with the solvent.

Figure 2F:
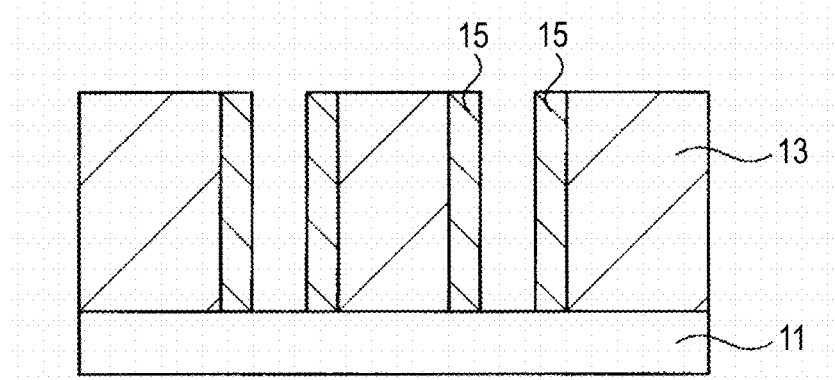

According to the process steps thus performed, a second resist pattern 15 is provided that is formed of the crosslinked layer of the chemical shrink material and decreases the size of the opening of the first resist pattern 13 as shown in FIG. 2F. Furthermore, the process steps of from FIG. 1C to FIG. 2F may be performed repeatedly depending on necessity, thereby forming a crosslinked portion of the chemical shrink material further on the second resist pattern 15, and thus a resist pattern having an opening that is further decreased in size may be provided.

Upon forming the second resist pattern 15, the resist patterns may be washed with water, a mixed solvent of water and a water-soluble organic solvent, or an organic solvent that does not dissolves the first resist pattern 13. For example, a mixed solvent of water and isopropanol mixed to a concentration of approximately from 1 to 30% by mass may be used for washing. The non-crosslinked portion of the second resist 14 is dissolved, and thereby the second resist pattern 15 is provided that is formed of the crosslinked layer of the chemical shrink material and decreases the size of the opening of the first resist pattern 13 as shown in FIG. 2F.

A semiconductor device may be produced in an ordinary method with the first resist pattern 13 and the second resist pattern 15 formed by the process steps of from FIG. 1A to FIG. 2F as a mask. For example, etching of an underlayer, ion implantation, and the like may be performed with the resist patterns as a mask, thereby producing a semiconductor device.

The miniaturization method of a pattern by forming a crosslinked layer in the second resist layer adjacent to the first resist pattern with an acid supplied from the first resist pattern has a problem of failing to achieve sufficient miniaturization due to shortage of the amount of the acid supplied. In the method for producing a semiconductor device according to the embodiment, on the other hand, the second resist composition (i.e., the chemical shrink material) containing an acid amplifier and a crosslinking material is used for forming the second resist layer. The use of the chemical shrink material generates and supplies a sufficient amount of an acid to the second resist layer. Accordingly, the second resist pattern having a sufficient thickness can be formed from the second resist layer, and thereby an opening of a resist pattern having a shape that is further miniaturized as compared to an ordinary one. Consequently, a semiconductor device having a shape or an impurity distribution that is further miniaturized as compared to an ordinary one can be produced.

2. Example of Method for Producing Semiconductor Device

The present technology will be described specifically below with reference to examples, in which a resist pattern was produced with the second resist composition (i.e., the chemical shrink material). In the following example, only the formation of a resist pattern in the production of a semiconductor device is performed, and the miniaturization of the shape of the opening of the resist pattern thus formed is investigated.

[Formation of First Resist Pattern]

The first resist pattern used for evaluation of the second resist pattern of the examples was produced. The second resist patterns of Examples and Comparative Example were formed on the first resist pattern for evaluation.

A resist pattern was formed with a resist for KrF lithography, P3593, available from Tokyo Ohka Kogyo Co., Ltd., which was a chemically amplified excimer resist, as the first resist composition.

The first resist composition was coated on a silicon wafer to a thickness of 1.1 μm by a spin coating method, and subjected to a prebaking treatment at 100° C. for 60 second for evaporating the solvent, thereby forming the first resist layer. The formation of the first resist layer was performed with Coater-Developer RF$^3$, available from Sokudo Co., Ltd.

The first resist layer thus formed was exposed by irradiating with KrF (krypton fluoride) excimer laser light having a wavelength of 248 nm with FPA-6000ES6a, available from Canon, Inc., with conventional illumination of NA (numerical aperture)=0.55 and σ=0.5.

After exposing, the first resist layer was subjected to a PEB treatment at 110° C. for 60 seconds with Coater-Developer RF$^3$.

Subsequently, the first resist layer was developed with a TMAH aqueous solution having a concentration of 2.38% by mass by paddle development, and then subjected to a heat treatment at 100° C. for 90 seconds. According to the procedures, the first resist pattern as a line-and-space pattern with a pitch of 1.5 μm was produced. The first resist pattern thus obtained had a space width (i.e., a width of the opening) of 0.5 μm and a resist width of 1.0 μm.

Example 1

Production of Second Resist Composition

The second resist composition (i.e., the chemical shrink material) was produced.

In a 1-L measuring flask, 100 g of pure water was added to 100 g of a 20% by mass solution of a polyvinyl acetal resin (S-Lec KW3 and KW1, available from Sekisui Chemical Co., Ltd.), and mixed under stirring at room temperature for 6 hours, thereby providing a 10% by mass aqueous solution of the polyvinyl acetal resin.

860 g of pure water and 40 g of IPA were mixed with 100 g of methoxymethylol melamine (Cymel 370, available from Mitsui Cyanamid, Ltd.), and mixed under stirring at room temperature for 6 hours, thereby providing an approximately 10% by mass aqueous solution of methoxymethylol melamine.

200 g of the 10% by mass aqueous solution of the polyvinyl acetal resin and 40 g of the approximately 10% by mass aqueous solution of methoxymethylol melamine thus produced were mixed under stirring at room temperature for 6 hours, thereby providing a mixed aqueous solution having a concentration of methoxymethylol melamine of 20% by mass with respect to the polyvinyl acetal resin.

[Synthesis of Acid Amplifier AA1]

Synthesis Method of AA1:
cis-3-(1-octanesulfonyloxy)-2-pinanol

In a four-neck flask, 2.0 g (11.8 mmol) of cis-2,3-pinandiol, 3 mL (0.02 mol) of triethylamine and 20 mg (0.16 mmol) of 4-dimethylaminopyridine were dissolved in 12 mL of chloroform, and the mixture was stirred for 1 hour over an ice bath. A chloroform solution of 1-octanesulfonyl chloride (2.52 g/10 mL) (11.8 mmol) was added dropwise thereto with a dropping funnel, and the mixture was stirred at room temperature for 1 day. Thereafter, iced water was added thereto, the mixture was stirred for 1 hour, and the solution was extracted with chloroform. The organic layer was rinsed with 2.4N HCl and a saturated sodium hydrogencarbonate solution in this order, and dried over anhydrous magnesium sulfate, and the solvent was distilled off under reduced pressure. The resulting liquid was purified by column chromatography (filler: silica gel (Wako Gel C-200), developing solvent: ethyl acetate/n-hexane=1/4), thereby providing 1.46 g of a yellow viscous liquid (yield: 36%).

The acid amplifier AA1 was thus synthesized in the aforementioned manner.

[Production of Inclusion Complex ICAA1]

The acid amplifier AA1 was then included in methyl-β-cyclodextrin (MβCD) to prepare a water-soluble acid amplifier. Specifically, the acid amplifier AA1 was added to an aqueous solution of methyl-β-cyclodextrin (MβCD) at a molar ratio of MβCD/AA1 of 1/2, i.e., an excessive amount of AA1, and the mixture was stirred for 12 hours. Thereafter, AA1 that was not included in MβCD but remained in the aqueous solution was removed by filtration. Thereafter, the solvent was distilled off from the resulting aqueous solution containing the inclusion complex of AA1 included in MβCD, thereby preparing the inclusion complex in the form of a white solid.

The inclusion complex (ICAA1) of AA1 included in methyl-β-cyclodextrin was thus prepared in the aforementioned manner.

[Formation of Second Resist Pattern]

A chemical shrink material of Example 1 was prepared by adding 40% by mass of the inclusion complex (ICAA1) to the mixed aqueous solution having a concentration of methoxymethylol melamine of 20% by mass with respect to the polyvinyl acetal resin.

The chemical shrink material of Example 1 containing the acid amplifier thus prepared was coated on the first resist pattern formed by using the chemically amplified excimer resist by a spin coating method at a rotation number of 3,000 rpm for a period of 30 seconds. After spin coating, the solvent (water) was evaporated from the coated resist by a heat treatment at 100° C. for 60 seconds. The resist was then subjected to a mixing bake treatment at 111° C. for 2 minutes, and then rinsed with water for 30 seconds.

The second resist pattern of Example 1 was thus formed in the aforementioned manner.

Example 2

The acid amplifier AA2 was synthesized in the following manner, and an inclusion complex ICAA2 of AA2 included in methyl-β-cyclodextrin was produced in the same manner as in Example 1 except that AA2 was used instead of AA1.

The second resist composition (i.e., the chemical shrink material) containing ICAA2 was produced, and the second resist pattern of Example 2 was formed, in the same manner as in Example 1 except that the conditions of the mixing bake treatment were changed. The mixing bake treatment in Example 2 was performed at 111° C. for 1 minute.

[Synthesis of Acid Amplifier AA2]

Synthesis Method of AA2:
cis-3-((+)-10-camphorsulfonyloxy)2-pinanol 1.0 g (5.9 mmol) of cis-2,3-pinandiol, 1.5 mL of triethylamine and 20 mg of 4-dimethylaminopyridine were dissolved in 6 mL of dichloromethane, and the mixture was stirred over an ice bath. A solution of 1.5 g (5.9 mmol) of (+)-10-camphorsulfonyl chloride dissolved in 5 mL of dichloromethane was added dropwise thereto. The resulting solution was stirred at room temperature for 2 days. After confirming that no further reaction proceeded by 1H-NMR, crashed ice was added thereto and stirred for 1 hour. The solution was extracted with dichloromethane. The organic layer was rinsed with 2.4N HCl and then with a saturated sodium hydrogencarbonate solution, and dried over anhydrous magnesium sulfate, and the solvent was distilled off under reduced pressure. The resulting liquid was purified by column chromatography (filler: silica gel (Wako Gel C-200), developing solvent: hexane/ethyl acetate=4/1), thereby providing 0.73 g of colorless crystals (yield: 32%).

The acid amplifier AA2 was thus synthesized in the aforementioned manner.

Example 3

The acid amplifier AA3 was synthesized in the following manner, and an inclusion complex ICAA3 of AA3 included in methyl-β-cyclodextrin was produced in the same manner as in Example 1 except that AA3 was used instead of AA1.

The second resist composition (i.e., the chemical shrink material) containing ICAA3 was produced, and the second resist pattern of Example 3 was formed, in the same manner as in Example 1.

[Synthesis of Acid Amplifier AA3]

Synthesis Method of AA3:
cis-3-(p-toluenesulfonyloxy)-2-pinanol

In a four-neck flask, 1.5 g (9 mmol) of cis-2,3-pinandiol, 1.37 g (14 mmol) of triethylamine and 0.3 g (2.5 mmol) of 4-dimethylaminopyridine were dissolved in 25 mL of chloroform, and the mixture was stirred for 1 hour over an ice bath. A chloroform solution of p-toluenesulfonyl chloride (1.9 g/8.3 mL) (10 mmol) was added dropwise thereto with a dropping funnel, and the mixture was stirred at room temperature for 1 day. Thereafter, iced water was added thereto, the mixture was stirred for 1 hour, and the solution was extracted with chloroform. The organic layer was rinsed with 2.4N HCl, a saturated sodium hydrogencarbonate solution and a saturated sodium chloride aqueous solution in this order, and dried over anhydrous magnesium sulfate, and the solvent was distilled off under reduced pressure. The resulting solid was purified by column chromatography (filler: silica gel (Wako Gel C-200), developing solvent: ethyl acetate/n-hexane=1/4), thereby providing 0.44 g of a white solid (yield: 15%).

The acid amplifier AA3 was thus synthesized in the aforementioned manner.

Example 4

The second resist pattern of Example 4 was formed by using the second resist composition (i.e., the chemical shrink material) produced in Example 1, in the same manner as in Example 1 except that the conditions of the mixing bake treatment were changed. The mixing bake treatment in Example 4 was performed at 111° C. for 2 minutes for the first heat treatment, and further performed at 120° C. for 1 minute for the second heat treatment for accelerating the acid amplification treatment.

Comparative Example 1

A second resist composition (i.e., a chemical shrink material) of Comparative Example 1 was produced, and the second resist pattern of Comparative Example 1 was formed, in the same manner as in Example 1 except that the acid amplifier was not added to the chemical shrink material.

[Results]

The resist patterns of Examples 1 to 4 and Comparative Example 1 were measured for the space width of the opening.

The space width of the opening of the first resist pattern before forming the second resist pattern was 0.50 μm.

The space width of the opening of the resist pattern having the second resist pattern formed in Example 1 was 0.24 μm. Accordingly, the shrinking amount of the opening of the resist pattern with the second resist pattern in Example 1 was 260 nm in total of both sides.

The space width of the opening of the resist pattern having the second resist pattern formed in Example 2 was 0.26 μm. Accordingly, the shrinking amount of the opening of the resist pattern with the second resist pattern in Example 2 was 240 nm in total of both sides.

The space width of the opening of the resist pattern having the second resist pattern formed in Example 3 was 0.24 μm. Accordingly, the shrinking amount of the opening of the resist pattern with the second resist pattern in Example 3 was 260 nm in total of both sides.

On the other hand, the space width of the opening of the resist pattern having the second resist pattern formed in Comparative Example 1 was 0.48 µm. Accordingly, the shrinking amount of the opening of the resist pattern with the second resist pattern in Comparative Example 1 was 20 nm in total of both sides.

It is understood from the results that the use of the acid amplifier contained in the second resist composition forms the second resist pattern that has a sufficiently large thickness as compared to an ordinary chemical shrink material. Accordingly, an opening of a resist pattern that is further minute as compared to an ordinary one can be produced.

The space width of the opening of the resist pattern having the second resist pattern formed in Example 4 was 0.20 µm. Accordingly, the shrinking amount of the opening of the resist pattern with the second resist pattern in Example 4 was 300 nm in total of both sides.

It is understood from the results that the second resist pattern of Example 4 provides a larger shrinking amount than Examples 1 to 3 and Comparative Example 1. In Example 4, the first heat treatment was performed as the mixing bake treatment, and the second heat treatment was performed for accelerating the acid amplification reaction. Accordingly, it is considered that in the process step of forming the crosslinked layer in the second resist layer, the diffusion of the acid and the acid amplification reaction are performed at temperatures that are controlled to the suitable ranges respectively, and thereby a favorable crosslinked portion can be provided.

FIGS. 3A to 3E are SEM micrographs of specimens of the resist patterns in Examples 1 to 3 and Comparative Example 1 and a specimen of the first resist pattern before forming the second resist pattern. The SEM observation of the resist pattern specimens was performed with SEM S3400, available from Hitachi High-Technologies Corporation.

Figure 3A:
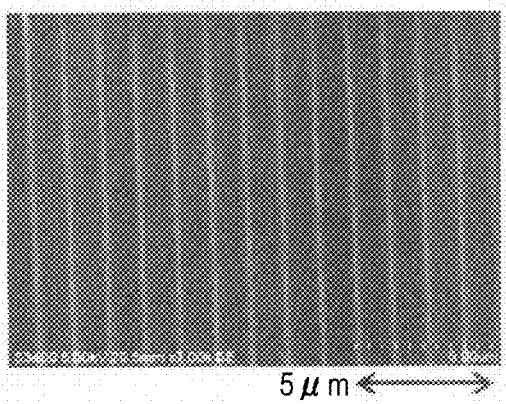
FIGS. 3A to 3E are SEM micrographs of specimens of resist patterns in Examples and Comparative Example.
Figure 3B:
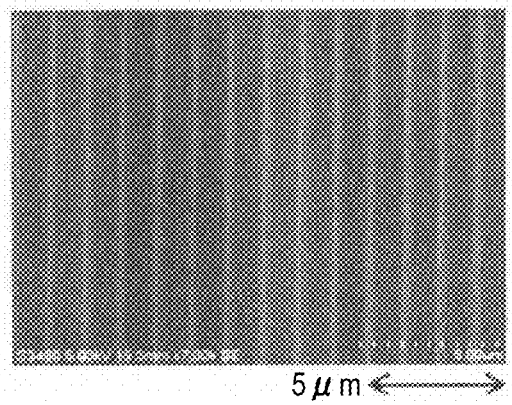
Figure 3C:
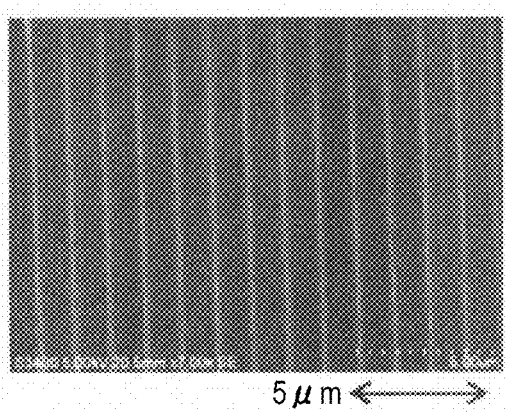
Figure 3D:
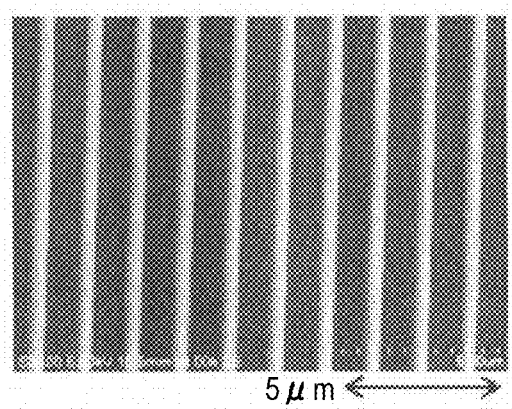
Figure 3E:
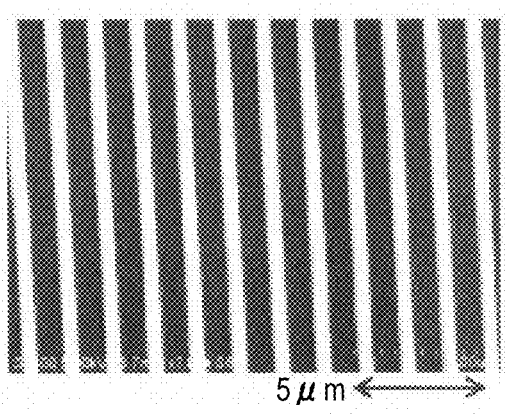

FIG. 3A shows the resist pattern after treating with the chemical shrink material containing ICAA1 in Example 1. FIG. 3B shows the resist pattern after treating with the chemical shrink material containing ICAA2 in Example 2. FIG. 3C shows the resist pattern after treating with the chemical shrink material containing ICAA3 in Example 3. FIG. 3D shows the resist pattern after treating with the chemical shrink material containing no acid amplifier in Comparative Example 1. FIG. 3E shows the resist pattern before treating with the chemical shrink material as a reference example.

In the resist pattern of Comparative Example 1 with no acid amplifier shown in FIG. 3D, the line width of the resist portion was thickened, and the width of the opening was decreased thereby, as compared to the resist pattern before treating with the chemical shrink material as shown in FIG. 3E. This is a result showing the miniaturization of the opening of the resist pattern obtained by using an ordinary chemical shrink material.

In the resist patterns of Examples 1 to 3 formed by using the chemical shrink materials containing the acid amplifiers AA1 to AA3 respectively, on the other hand, the opening of the resist pattern is further miniaturized as compared to the resist pattern of Comparative Example 1.

The use of a chemical shrink material containing an acid amplifier and a crosslinking material in the second resist layer generates and supplies an acid in a sufficient amount to the second resist layer. Accordingly, the second resist pattern with a sufficient thickness can be formed from the second resist layer, and thereby a semiconductor device having a further minute shape or impurity distribution as compared to an ordinary one can be produced.

The aforementioned embodiment describes the structure where the second resist pattern is formed on the side wall of the first resist pattern, but the portion where the second resist pattern is formed is not particularly limited. For example, the second resist pattern may be formed on the upper portion of the first resist pattern.

The present technology is not limited to the constitutions described in the aforementioned embodiments and examples, and various modifications, combinations and alternations may be made therein unless they deviate from the gist of the present technology.

The present disclosure contains subject matter related to that disclosed in Japanese Priority Patent Application JP 2010-217862 filed in the Japan Patent Office on Sep. 28, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for producing a semiconductor device, comprising:
    forming a first resist pattern capable of supplying an acid, with a first resist composition, on a semiconductor substrate;
    forming a second resist layer by coating a second resist composition containing a crosslinking material that is crosslinked in the presence of an acid, an acid amplifier, an inclusion compound, and a solvent, on the first resist pattern,
    wherein the inclusion compound includes the acid amplifier;
    forming a crosslinked portion in the second resist layer by diffusing an acid from the first resist pattern into the second resist layer; and
    removing a portion of the second resist layer that is not crosslinked.

2. The method for producing a semiconductor device according to claim 1, wherein the crosslinked portion is formed in the second resist layer by a first heat treatment for diffusing the acid from the first resist pattern into the second resist layer and a second heat treatment for acid amplification reaction with the acid amplifier in the second resist layer.

3. The method for producing a semiconductor device according to claim 2, wherein the first heat treatment is performed at a temperature of from 70 to 150° C., and the second heat treatment is performed at a temperature of from 80 to 160° C.

4. The method for producing a semiconductor device according to claim 1, wherein the inclusion compound is capable of forming a water-soluble inclusion complex with the acid amplifier.

5. The method for producing a semiconductor device according to claim 1, wherein the inclusion compound includes a plurality of glucose molecules.

* * * * *